United States Patent [19]

Ando

[11] Patent Number: 4,922,343
[45] Date of Patent: May 1, 1990

[54] APPARATUS FOR DETECTING FREQUENCY OF INPUT SIGNAL WITH A DIGITAL SCANNING G-CONVERTER

[75] Inventor: Naotaka Ando, Saitama, Japan

[73] Assignee: Sony Corporation, Tokyo, Japan

[21] Appl. No.: 314,877

[22] Filed: Feb. 24, 1989

[30] Foreign Application Priority Data

Mar. 14, 1988 [JP] Japan .................. 63-059974

[51] Int. Cl.$^5$ ............................................. H04N 5/04
[52] U.S. Cl. .................................. 358/148; 324/78 D; 358/158
[58] Field of Search ............ 358/148, 158; 324/79 D, 324/78 Q, 78 D; 328/141; 340/825.64, 825.71; 307/526

[56] References Cited

U.S. PATENT DOCUMENTS

| | | | |
|---|---|---|---|
| 3,735,387 | 5/1973 | Miller | 324/78 D |
| 4,751,576 | 6/1988 | Mehrgardt | 358/148 |

Primary Examiner—James J. Groody
Assistant Examiner—David E. Harvey
Attorney, Agent, or Firm—Lewis H. Eslinger; Donald S. Dowden

[57] ABSTRACT

A frequency detector is used with a digital scanning converter that enables a monitor receiver having a particular horizontal deflection frequency to monitor various video signals having various horizontal frequencies. The frequency detector has a counter for counting a reference clock during a predetermined time interval derived from an input signal to be measured and a computing circuit for adding or subtracting a first constant to or from a setting cycle in response to a difference between a count value of the counter and the setting cycle. When the difference between the count value and the setting cycle exceeds a second constant during a predetermined number of such time intervals, the setting cycle is adjusted by an output from the computing circuit, and an approximate value of a cycle of the signal to be measured is computed, thereby detecting the approximate frequency. This process goes through as many iterations as necessary to bring the difference between the count value of the counter and the setting cycle to a value less than the second constant. Even when the frequency of a signal to be measured has a value selected from a number of values that differ greatly from one another, the frequency detector thus homes-in on the period of the signal to be measured and enables detection of the frequency with high accuracy. Also, even when pulse dropouts or time base fluctuations occur in the signal to be measured, the frequency detector can obtain a stable detected value.

7 Claims, 3 Drawing Sheets

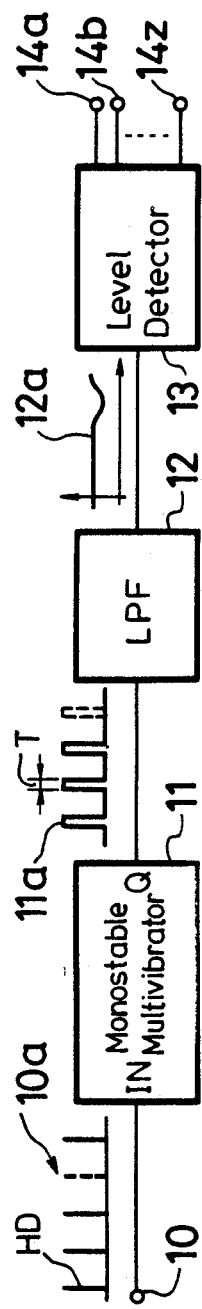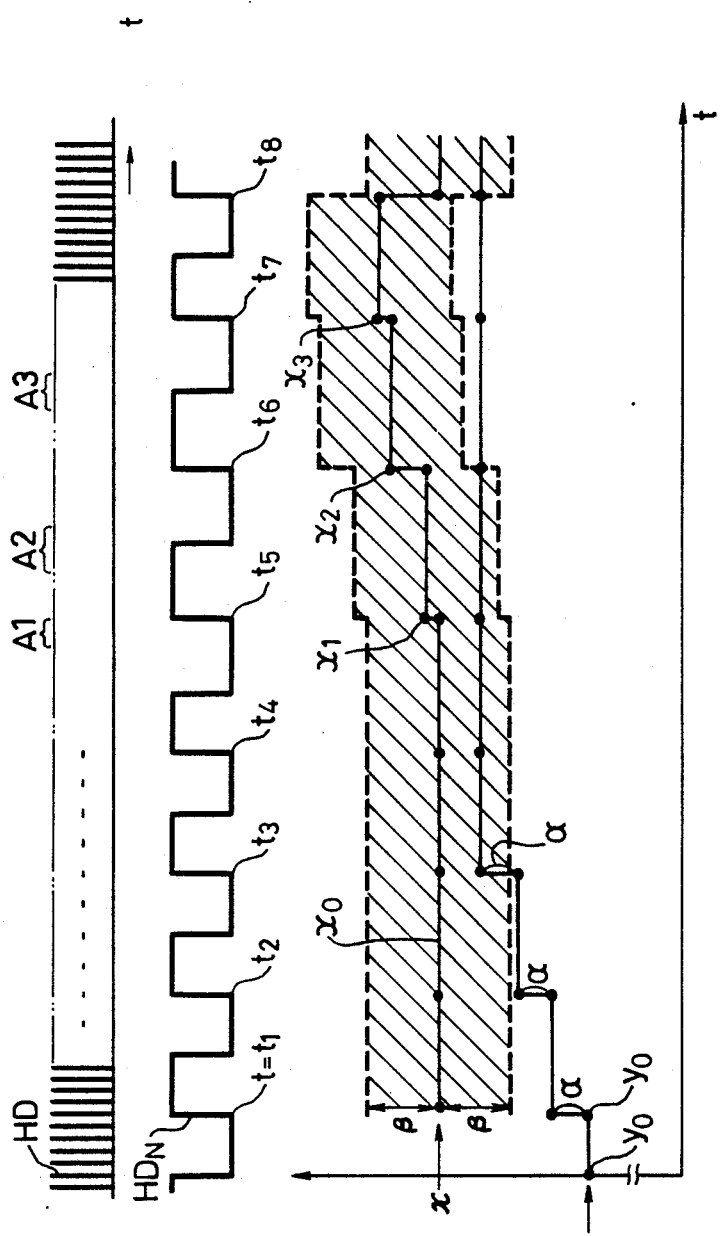
FIG. 2 (PRIOR ART)
FIG. 4A
FIG. 4B
FIG. 4C

APPARATUS FOR DETECTING FREQUENCY OF INPUT SIGNAL WITH A DIGITAL SCANNING G-CONVERTER

BACKGROUND OF THE INVENTION

1. Field of the Invention

The present invention relates generally to a frequency detector and, more particularly, to an apparatus for detecting the frequency of an input signal with a digital scanning-converter.

2. Description of the Prior Art

Recently, computers with various functions have been developed and widely used, but horizontal synchronizing signals of video signals delivered from these computers have not yet been standardized. Therefore, a scanning-converter apparatus is required to enable a single monitor to check or monitor various input video signals having various horizontal frequencies. For such a scanning-converter apparatus, the assignee of the present application has previously proposed a scanning-converter apparatus that can be used in a monitor system of the type shown in FIG. 1. This previously-proposed scanning-converter apparatus is disclosed in Japanese patent application No. 61-250592.

FIG. 1 illustrates in diagrammatic form a monitor system that includes a television tuner 1, a high density personal computer 2 and another computer 3. The television tuner 1 produces a video signal having a horizontal frequency $f_{H1}$ selected to be 15.75 kHz, the personal computer 2 produces a video signal having a horizontal frequency $f_{H2}$ selected to be 24 kHz, and the computer 3 produces a video signal having a horizontal frequency $f_{H3}$ selected to be 27.15 kHz. These video signals are supplied to a scanning converter apparatus 4, in which they are converted into a video signal having a horizontal frequency of 63.35 kHz, which is fed to a monitor 9 whose horizontal deflection frequency $f_H$ is 63.35 kHz.

When the incoming video signal from, for example, the computer 3 is received and reproduced by the monitor 9, seven horizontal scanning lines of the output video signal from the scanning converter apparatus 4 have to be provided corresponding to three horizontal scanning lines of the input video signal to the scanning-converter apparatus 4, because the ratio between the horizontal frequency $f_{H3}$ of the incoming video signal from the computer 3 to the horizontal deflection frequency $f_H$ of the monitor 9 is $$f_{H3}:f_H = 27.15 \text{ kHz}:63.35 \text{ kHz} = 3:7$$

Accordingly, an interpolation computation must be carried out in order to obtain a sufficiently smooth and natural looking output picture image. The coefficient used in the interpolation computation depends on the horizontal frequency of the input video signal, so it is necessary to provide a circuit that can accurately detect the horizontal frequency of the input video signal. The circuit illustrated in FIG. 2 is representative of a prior-art frequency detector that has been proposed for this purpose.

As FIG. 2 shows, a horizontal synchronizing signal HD of the input video signal is supplied to an input terminal 10. The horizontal synchronizing signal HD has a frequency of $f_H$. The input terminal 10 is connected to an input terminal IN of a monostable multivibrater 11 so that, in response to each leading edge of the horizontal synchronizing signal HD, the monostable multivibrator 11 produces at its output terminal Q a pulse train 11a of a predetermined pulse width T. This pulse train 11a is converted into a direct current signal 12a by a low-pass filter (LPF) 12 and is then fed to a level detector 13. The level detector 13 is composed of a plurality of comparators (not shown) having different comparison or reference levels, and only a comparator with a reference level higher than the level of the direct current signal 12a produces an output of high level "1". The output signal is directly supplied to output terminals 14a, 14b, . . . 14z. When the horizontal frequency $f_H$ of the horizontal synchronizing signal HD is increased and its pulse interval is reduced, the value of the direct current signal 12a, which is the output signal from the low-pass filter 12, is increased so that the frequency $f_H$ of the horizontal synchronizing signal HD can be identified stepwise by detecting which one of the output terminals 14a to 14z produces an output signal of high level "1".

In the prior art frequency detector as described above, however, a constant number of the output pulses 11a of the monostable multivibrator 11 is required, and when the frequency of the horizontal synchronizing signal HD constituting the signal to be measured is increased beyond a certain point, the pulses in the pulse train 11a from the monostable multivibrator 11 overlap one another, causing a detection error.

Particularly, when an incoming video signal is derived from a cassette-type VTR (video tape recorder) or the like, it is frequently observed that a fluctuation (jitter) of pulses exists in the time base of the horizontal synchronizing signal HD or a pulse dropout 10a occurs therein as shown in FIG. 2. This jitter or pulse dropout is directly detected as a detection level change by the prior-art frequency detector, so that the detected value becomes inaccurate and unstable. If such detected value is employed for signal processing, a deleterious influence will be exerted upon a peripheral circuit in which the detected value is employed.

OBJECTS AND SUMMARY OF THE INVENTION

Accordingly, an object of the present invention is to provide an improved apparatus for detecting the frequency of an input signal suitable for use with a digital scanning-converter.

Another object of the present invention is to provide a frequency detector that can stably detect the frequency of a signal to be measured with high accuracy over a wide range even when the frequency is changed.

Another object of the present invention is to provide a frequency detector that can stably detect a frequency regardless of the occurrence of a pulse dropout in a signal to be measured.

According to one aspect of the present invention, there is provided a frequency detector comprising: means for producing a cyclical reference clock signal; means for receiving an input signal having a frequency to be measured; a counter for counting cycles of said reference clock signal repetitively during successive intervals of time derived from said input signal; means for establishing a setting cycle; and a computing circuit connected to said counter and to said means for establishing a setting cycle for adding or subtracting a first constant to or from said setting cycle in response to a difference between a count value of said counter and said setting cycle; wherein, when said difference between said count value of said counter and said setting cycle exceeds a second constant during a predetermined number of said successive intervals, said setting cycle is adjusted by an output from said computing circuit and an approximate value of a cycle of said input signal is computed, thereby detecting the approximate frequency of said input signal.

According to another aspect of the present invention, there is provided a frequency detector comprising: means for producing a reference clock signal of a given frequency; means for receiving a pulsed input signal having a frequency $f_H$ to be measured and period $T_H$ and for dividing said pulsed input signal by N to produce an N-divided output signal; a counter for counting cycles of said reference clock signal, said counter being reset by successive cycles of said N-divided output signal; means for latching the value of the cycles counted by said counter during said successive cycles of said N-divided output signal; means for establishing a setting cycle; and a computing circuit connected to said means for latching and to said means for establishing said setting cycle for adding or subtracting a first constant to or from said setting cycle in response to a difference between a latched value of said counter and said setting cycle; wherein, when said difference between said latched value of said counter and said setting cycle exceeds a second constant during a predetermined number of said successive cycles of said N-divided output signal, said setting cycle is adjusted by an output from said computing circuit and an approximate value of $T_H$ is computed, thereby detecting the approximate frequency of $f_H$ of said pulsed signal; and, when said difference between said latched value of said counter said setting cycle fails to exceed said second constant during said predetermined number of said successive cycles of said N-divided output signal, said setting cycle is not adjusted and a previous detected value of $f_H$ is employed.

According to a further aspect of the the present invention, there is provided a method of detecting a frequency $f_H$ of a pulsed input signal comprising the steps of: producing a reference clock signal of a given frequency; receiving said pulsed signal and dividing said received pulsed signal by N to produce an N-divided output signal; counting cycles of said reference clock signal during successive cycles of said N-divided output signal; latching the value of the cycles of said reference clock signal counted during said successive cycles of said N-divided output signal; establishing a setting cycle; comparing a latched value of the cycles counted and said setting cycle; adding or subtracting a first constant to or from said setting cycle in response to a difference between said latched value of the cycles counted and said setting cycle; adjusting said setting cycle in accordance with said adding or subtracting when the difference between said latched value and said setting cycle exceeds a second constant during a predetermined number of said successive cycles of said N-divided output signal, thereby determining an approximate value of $T_H$; and determining the approximate frequency $f_H$ on the basis of $T_H$.

The preceding and other objects, features and advantages of the present invention will become apparent from the following detailed description of the preferred embodiment thereof to be taken in conjunction with the accompanying drawings, in which like reference numerals identify like elements and parts.

BRIEF DESCRIPTION OF THE DRAWINGS

FIG. 2 is a block diagram showing an example of a prior-art frequency detector;

FIGS. 4A to 4C are respectively diagrams used to explain a process for detecting a frequency by the embodiment in FIG. 3.

DESCRIPTION OF THE PREFERRED EMBODIMENT

The following description of the principle of the invention will facilitate an understanding of the description of the preferred embodiment of the invention, which is set out later.

A frequency detector instructed in accordance with the present invention comprises, as shown for example in FIG. 3, a counter 18 for counting a reference clock F during an N-divided period of a horizontal synchronizing signal HD serving as a signal to be measured and an adding/subtracting circuit 21 for adding or subtracting (only under the condition described below) a first constant $\alpha$ to or from a setting cycle y in response to a level difference between a count value x of the counter 18 and the setting cycle y. In particular, when the difference between the count value x of the counter 18 and the setting cycle y exceeds a second constant $\beta$, an approximate value of a period $T_H$ of the horizontal synchronizing signal HD is obtained while changing the setting cycle y by $\pm \alpha$ to produce an output value y$\pm \alpha$. This process is repeated as necessary to enable detection of the period and therefore the frequency $f_H$ of the horizontal synchronizing signal HD.

According to the present invention, as set forth above, if the frequency of the reference clock F is taken as $f_{CK}$ and the period of the horizontal synchronizing signal HD is taken as $T_H$, the count value x of the reference clock F during the N-divided period of the horizontal synchronizing signal HD is expressed as:

$$x = N \cdot T_H \cdot f_{CK} \qquad (1)$$

Until the difference between the count value x and the setting cycle y becomes less than the second constant $\beta$, the first constant $\alpha$ is added to or subtracted from the setting cycle y. Therefore, in case of an error $\pm \beta$ as shown in FIG. 4C, there is obtained from equation (1) the following equation:

$$y - x = N \cdot T_H \cdot f_{CK} \qquad (2)$$

Since x, N and $f_{CK}$ are already known, an approximate value of the period $T_H$ of the horizontal synchronizing signal HD can be calculated from equation (2). Further, since the frequency $f_H$ of the horizontal synchronizing signal HD is the reciprocal of the period $T_H$, the frequency $f_H$ can be obtained from the period $T_H$.

If a pulse dropout occurs in the horizontal synchronizing signal HD, the setting value y is not changed so long as the difference between the count value x and the setting value y is less than $\pm \beta$. A stable detected value of the frequency $f_H$ is thus reliably obtained in spite of possible dropouts of the signal to be detected.

A preferred embodiment of a frequency detector constructed in accordance with the present invention will now be described with reference to the drawings.

Figure 1:
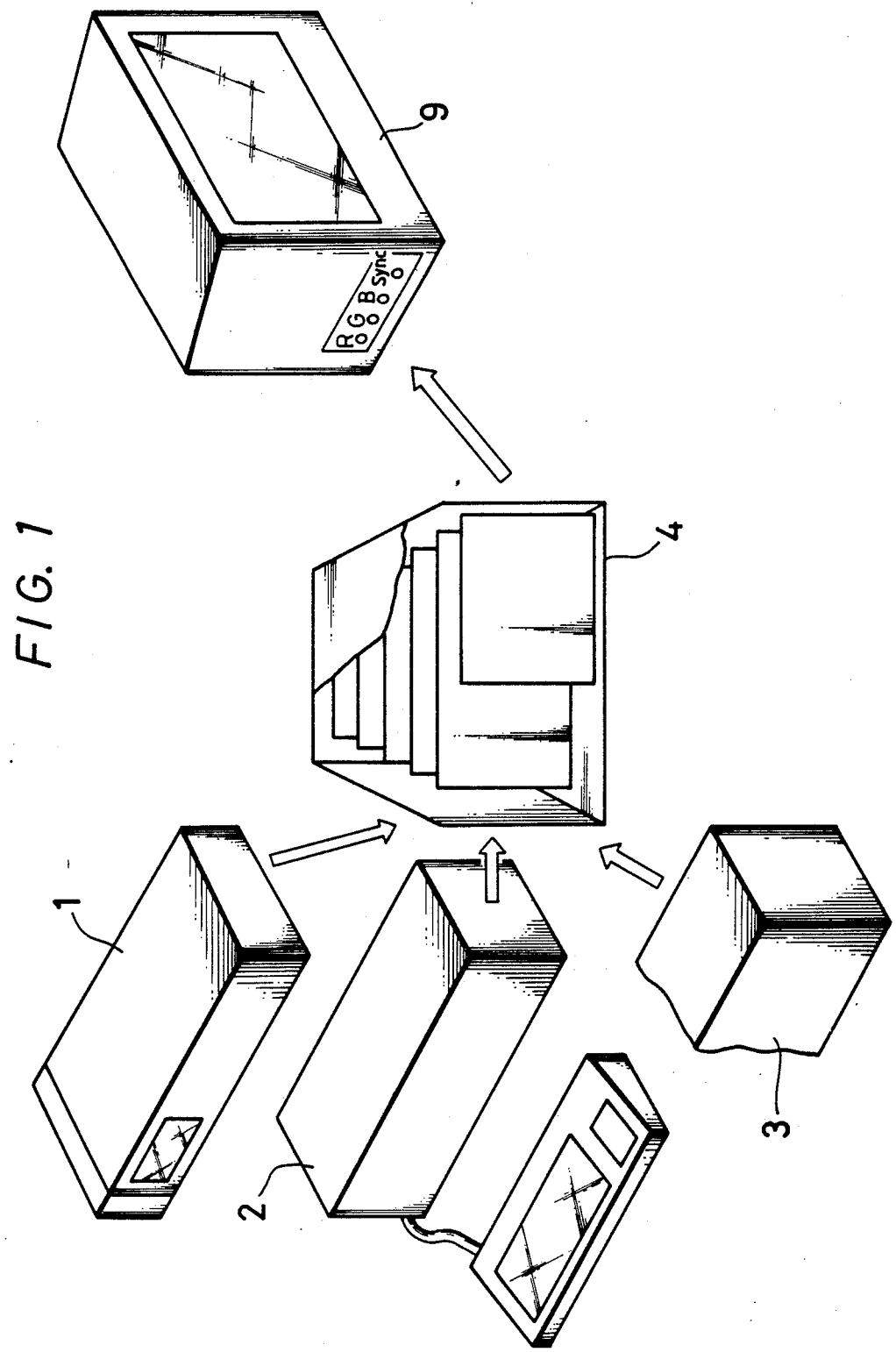
FIG. 1 is a fragmentary, diagrammatic, cut-away perspective view illustrating an example of a monitor system that utilizes a scan converter apparatus.
Figure 3:
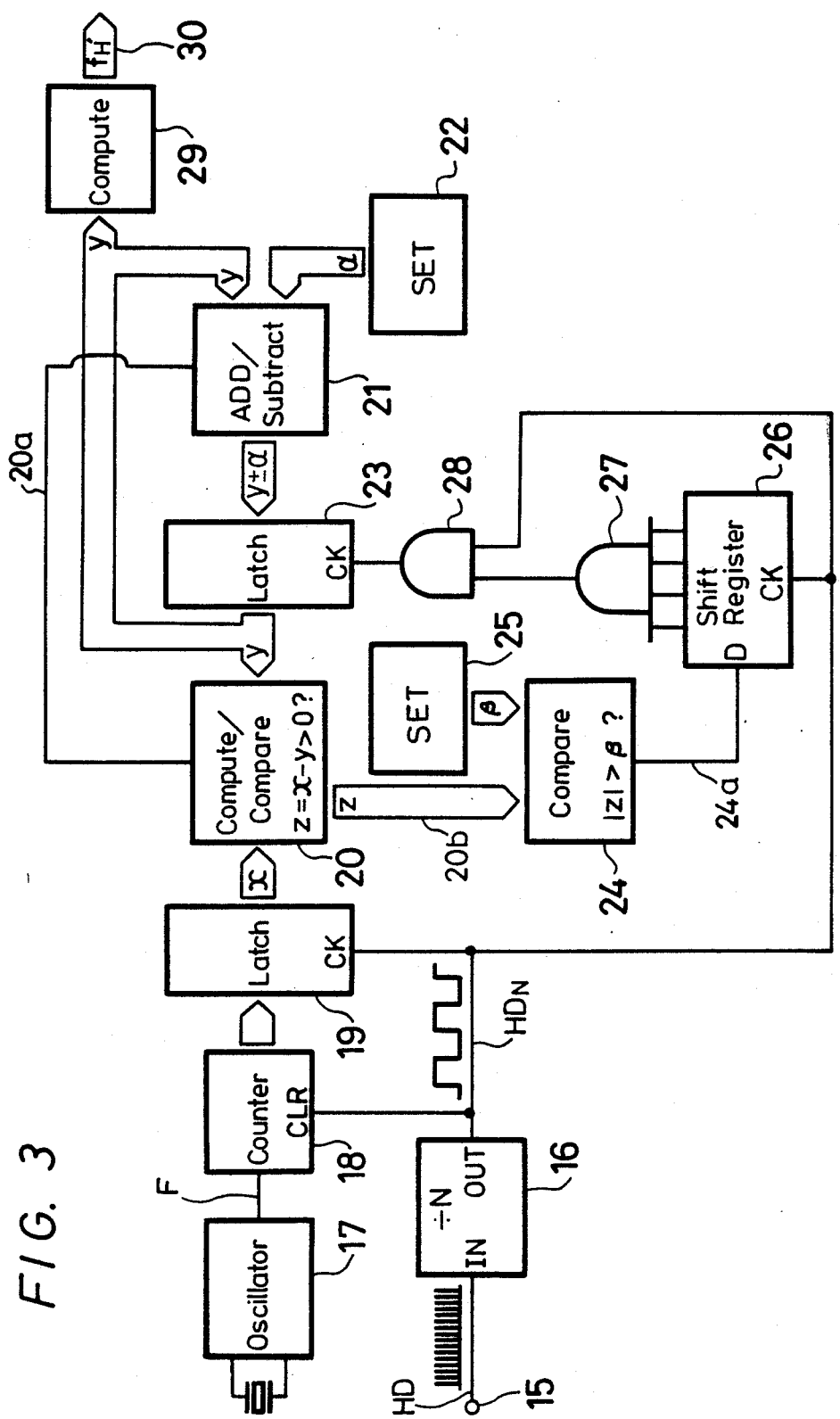
FIG. 3 is a block diagram showing an embodiment of a frequency detector constructed in accordance with the present invention.

The block diagram forming FIG. 3 shows in detail a preferred embodiment of a frequency detector constructed in accordance with the present invention. As that figure shows, an input terminal 15 is supplied with the horizontal synchronizing signal HD of frequency $f_H$ and period $T_H$. The frequency $f_H$ of the horizontal synchronizing signal HD generally falls within a range of 15 kHz to 130 kHz. The input terminal 15 is connected to an input terminal IN of a divide-by-N frequency divider 16, hereinafter referred to as an N frequency divider. The N frequency divider 16 produces at its output terminal OUT a signal $HD_N$ which results from dividing the horizontal synchronizing signal HD by N. In the preferred embodiment of the invention, N=128.

An oscillator 17 produces a reference clock F having a frequency $f_{CK}$. The reference clock F is supplied to a trigger terminal of a succeeding counter 18. The count value of the counter 18 is supplied to an input terminal of a latch circuit 19, and the N-divided signal $HD_N$ is supplied to the clear terminal CLR of the counter 18 and the clock terminal CK of the latch circuit 19. Accordingly, a value x held at the output terminal of the latch circuit 19 indicates the number of pulses of the reference clock F counted during every N cycle of the horizontal synchronizing signal HD. The value x is expressed by the following equation:

$$x = N.T_H/(1/f_{CK}) = N.T_H.CK \qquad (3)$$

Thus, x is sometimes referred to hereinafter as a cycle count value.

The cycle count value x is supplied to one input terminal of a computing and comparing circuit 20, while the computing and comparing circuit 20 receives at its other input terminal a setting cycle y which homes-in on the value of x in one or more iterations as will be explained in more detail later. The computing and comparing circuit 20, on the basis of the cycle count value x and setting cycle y received as inputs, calculates an error value z that is defined as:

$$z = x - y \qquad (4)$$

and supplies the same as an error signal to an output signal line 20b. At the same time, the circuit 20 supplies a compared signal 20a corresponding to the positive or negative polarity of the error z to the adding/subtracting circuit 21. The compared signal 20a is set at high level "1" when the error z, for example, is positive or zero, while it is set a low level "0" when the error z is negative.

The adding/subtracting circuit 21 is supplied at one of its input terminals with the setting cycle y and at another of its input terminals with a constant $\alpha$ that is set by a setting circuit 22. In general, the frequency $f_H$ of the horizontal synchronizing signal HD is selected to be about 20 kHz (period of 0.05 ms) so that, if $T_0=0.05$ ms, the constant $\alpha$ is selected so as to satisfy the following equation:

$$\alpha = N.T_0.f_{CK}/512 \qquad (5)$$

The adding/subtracting circuit 21 produces, when the compared signal 20a is at high level "1", or an inequality $x-y \geq 0$ is established, an output of $y+\alpha$, while it produces, when the compared signal 20a is at low level "0", or an inequality $x-y<0$ is established, an output $y-\alpha$. The output value $y \pm \alpha$ from the adding/subtracting circuit 21 is supplied to an input terminal of a latch circuit 23, which latches to this value as the updated value of y.

The error z, which is the output value of the computing and comparing circuit 20, is supplied to one input terminal of a comparing circuit 24, and the comparing circuit 24 is supplied at its other input terminal with an output value $\beta$ from a setting circuit 25. The comparing circuit 24 supplies a compared signal 24a to a data terminal D of an M-bit shift register 26. The compared signal 24a goes to a high level "1" when $|z|>\beta$ is established, while it goes to a low level "0" when $|z| \leq \beta$. In the preferred embodiment of the invention, the value $\beta$ is set so as to satisfy the following equation:

$$\beta = N.T_0.f_{CK}/256 = 2\alpha \qquad (6)$$

Generally, the value $\beta$ is selected to be such that the value $\alpha$ becomes smaller than $2\beta$ or even, as FIG. 4C shows, smaller than $\beta$.

In this embodiment, M of the M-bit shift register 26 is selected to be a plurality such as four (M=4), and the four-bit output signals from the shift register 26 are supplied to input terminals of a four-input AND gate 27. The output signal from the four-input AND gate 27 is supplied to one input terminal of an AND gate 28, and the N-divided signal $HD_N$ is supplied to the other input terminal of the AND gate 28 and to the clock terminal CK of the M-bit shift register 26. The output signal from the AND gate 28 is supplied to the clock terminal CK of the latch circuit 23 so that, if the N-divided signal $HD_N$ rises when the four-bit output signal of the M-bit shift register 26 is at high level "1" and the output of the AND gate 27 is therefore also high, the setting cycle y, which is the output value of the latch circuit 23, is changed to the output value $y \pm \alpha$ of the adding/subtracting circuit 21.

The latch circuit 23 acts to set the setting cycle y, when the power switch is turned ON, at $N.T_0.f_{CK}$ by using the cycle or period $T_0$ where the frequency is 20 kHz. Therefore, this value of y is referred to as the initial setting cycle or period. Since the output of the M-bit shift register 26 goes to a high level so long as the compared signal 24a is at a high level, the setting cycle y is adjusted to a value of $y \pm \alpha$ at the leading edge of the N-divided signal $HD_N$, and thus the setting cycle y approaches the cycle count value x. When the compared signal 24a finally goes to a low level "0", or the relationship $$|z| = |x-y| \leq \beta \qquad (7)$$

is established, the output signal from the four-input AND gate 27 goes to a low level so that the setting cycle y as the output value of the latch circuit 23 is not further adjusted. Accordingly, since the setting cycle y is fixed near the cycle count value x within the error $\pm \beta$, from equations (3) and (6), there is obtained the following inequality $$|N.T_H.f_{CK} - y| \leq N.T_0.f_{CK}/256$$

From this it follows that the inequality $$T_H - \frac{T_0}{256} \leq \frac{y}{N \cdot f_{CK}} \leq T_H + \frac{T_0}{256} \qquad (8)$$

is established. Since N and $f_{CK}$ are already known, the cycle $T_H$ of the horizontal synchronizing signal HD is calculated from the value of cycle y within the error of $\pm T_0/256$.

This setting cycle y is supplied to a computing circuit 29, and the computing circuit 29 computes a detecting frequency $f_H{}'$, of the horizontal synchronizing signal HD on the basis of the following equation:

$$f_H{}' = N \cdot f_{CK}/y \qquad (9)$$

If $\Delta f$ assumes the maximum error of the detecting frequency $f_H{}'$, then, from equation (8), $\Delta f$ can be expressed by the following equation:

$$\Delta f = \frac{1}{T_H - T_0/256} - \frac{1}{T_H} = \qquad (10)$$

$$\frac{f_H}{1 - f_H/(256 f_0)} - f_H \sim f_H (f_H/f_0)/256$$

The maximum error $\Delta f$ when the frequency $f_H$ of the horizontal synchronizing signal HD is $f_0$ (20 kHz) becomes about 0.1 kHz.

The operation of this embodiment of the invention until the setting cycle y is stabilized in the frequency detector is as follows: Let it be assumed that the cycle or period $T_H$ of the horizontal synchronizing signal HD is longer than the cycle or period $T_0$, that the horizontal synchronizing signal HD and its N-divided counterpart signal $HD_N$ are presented as shown in FIGS. 4A and 4B, respectively, and that all bits of the output from the M-bit shift register 26 in FIG. 3 are set at a high level "1". The hatched area in FIG. 4C is the area in which the error of the cycle count value x lies within $\pm \beta$.

At this time, the value of the setting cycle y when the power switch is turned ON is set at $y_0 (= N \cdot T_0 \cdot f_{CK})$. At time $t_1$ at which the N-divided signal $HD_N$ rises, since $T_H > T_0$ is established as indicated above, the inequality $x > y$ is established and the setting value y is adjusted to $y_0 + \alpha$ (see FIG. 4C). Similarly, at times $t_2$ and $t_3$ where the N-divided signal $HD_N$ respectively rises, the setting value y is adjusted to $y + \alpha$. In this case, the setting value y which is changed at time $t_3$ satisfies $x - y < \beta$ so that the compared signal 24a of the comparing circuit 24 in FIG. 3 goes to a low level. Accordingly, at the next time $t_4$ in which the N-divided signal $HD_N$ rises, the value held in the latch circuit 23 in FIG. 3 is not updated. As a result, as FIG. 4C shows, the setting cycle y is not adjusted. Further, if there is a pulse dropout A1 in the horizontal synchronizing signal HD as shown in FIG. 4A, the cycle count value x at time $t_5$ at which the N-divided signal $HD_N$ rises is changed to $x_1$. In this case, however, the relationship expressed by the inequality $x - y \leq \beta$ is satisfied so that the setting cycle y at time $t_6$ at which the N-divided signal $HD_N$ rises next is not changed at all.

If there is a large pulse dropout A2 in the horizontal synchronizing signal HD (see FIG. 4A) before time $t_6$, the value of the cycle count value x is changed to $x_2$, satisfying $x - y > \beta$. Thus, the compared signal 24a of the comparing circuit 24 in FIG. 3 goes to a high level. However, at times $t_4$, $t_5$ and $t_6$, data of three bits at a low level are stored in the M-bit shift register 26 so that at time $t_7$ at which the N-divided signal $HD_N$ rises next, the output signal from the AND gate 28 shown in FIG. 3 stays at a low level. Thus, again in this case, the setting cycle y is not changed at all. Further, even if there is a large pulse dropout A3 in the horizontal synchronizing signal HD between times $t_0$ $t_6$ and $t_7$ as shown in FIG. 4A and the cycle count value x is changed to $x_3$, the output from the AND gate 28 shown in FIG. 3 stays at a low level, thus inhibiting the setting cycle y from being adjusted at time $t_8$ at which the N-divided signal $HD_N$ rises. Therefore, the detecting frequency $f_H{}'$ calculated on the basis of the equation (9) is stable even in the presence of dropouts.

In this embodiment, since the four-bit shift register is used as the M-bit shift register 26 in FIG. 3, the value of the setting cycle y is not adjusted so long as the condition expressed by the inequality $|x - y| > \beta$ does not occur four times consecutively at the leading edge of the N-divided signal $HD_N$. Accordingly, even if pulse dropouts occur in the horizontal synchronizing signal HD in succession, the detecting frequency does not fluctuate and undesired switching, hunting or the like does not occur in the succeeding circuitry.

Since the error between the cycle count value x and the setting cycle y quickly settles within the constant $\beta$, the setting cycle y is not varied at all regardless of the fluctuation of the horizontal synchronizing signal HD from a time base standpoint. Also, even when the frequency of the horizontal synchronizing signal HD is increased, the frequency can be detected with accuracy substantially the same as that described above.

In addition to detecting the frequency of the horizontal synchronizing signal of the incoming video signal as described above, the frequency detector of the present invention is effective in obtaining a stable frequency under the circumstance that the frequency of a signal to be measured fluctuates because of the occurrence of pulse dropouts, time base errors or the like.

A frequency detector constructed in accordance with the present invention as described above can detect the frequency to be measured with high accuracy even if the frequency of the signal may have any frequency within a wide range. Also, the frequency detector of the present invention can stably detect the frequency regardless of the occurrence of pulse dropouts, time base variations or the like in the signal to be measured.

The description set out above is of course presented merely by way of example. While a single preferred embodiment of the invention is described, it will be apparent that many modifications and variations thereof can be effected by one having ordinary skill in the art without departing from the spirit and scope of the novel concepts of the invention. For example, the M-bit shift register 26 is not limited to four outputs, and the values of $\alpha$ and $\beta$ can be adjusted in the discretion of a user of the apparatus, as those skilled in the art will readily understand. The scope of the invention should therefore be determined only by the appended claims.

What is claimed is:

1. A frequency detector comprising:
   means for producing a cyclical reference clock signal;
   means for receiving an input signal having a frequency to be measured;
   a counter for counting cycles of said reference clock signal repetitively during successive intervals of time derived from said input signal;
   means for establishing a setting cycle; and a computing circuit connected to said counter and to said means for establishing a setting cycle for adding or subtracting a first constant to or from said setting cycle in response to a difference between a count value of said counter and said setting cycle;

wherein, when said difference between said count value of said counter and said setting cycle exceeds a second constant during a predetermined number of said successive intervals, said setting cycle is adjusted by an output from said computing circuit and an approximate value of a cycle of said input signal is computed, thereby detecting the approximate frequency of said input signal.

2. A frequency detector according to claim 1 wherein, when said difference between said count value and said setting cycle fails to exceed said second constant during said predetermined number of intervals, said setting cycle is not adjusted, whereby protection is obtained against premature adjustment of said setting cycle in response to dropouts or time base fluctuations occurring in said input signal.

3. A frequency detector according to claim 2 wherein said predetermined number of intervals is a plurality.

4. A setting cycle according to claim 2 wherein said predetermined number of intervals is four.

5. A frequency detector comprising:
means for producing a reference clock signal of a given frequency;
means for receiving a pulsed input signal having a frequency $f_H$ to be measured and period $T_H$ and for dividing said pulsed input signal by N to produce an N-divided output signal;
a counter for counting cycles of said reference clock signal, said counter being reset by successive cycles of said N-divided output signal;
means for latching the value of the cycles counted by said counter during said successive cycles of said N-divided output signal;
means for establishing a setting cycle; and
a computing circuit connected to said means for latching and to said means for establishing said setting cycle for adding or subtracting a first constant to or from said setting cycle in response to a difference between a latched value of said counter and said setting cycle;
wherein, when said difference between said latched value of said counter and said setting cycle exceeds a second constant during a predetermined number of said successive cycles of said N-divided output signal, said setting cycle is adjusted by an output from said computing circuit and an approximate value of $T_H$ is computed, thereby detecting the approximate frequency of $f_H$ of said pulsed signal; and, when said difference between said latched value of said counter said setting cycle fails to exceed said second constant during said predetermined number of said successive cycles of said N-divided output signal, and said setting cycle is not adjusted and a previous detected value of $f_H$ is employed.

6. A method of detecting a frequency $f_H$ of a pulsed input signal comprising the steps of:
producing a reference clock signal of a given frequency $f_{CK}$;
receiving said pulsed signal and dividing said received pulsed signal by N to produce an N-divided output signal;
counting cycles of said reference clock signal during successive cycles of said N-divided output signal;
latching the value of the cycles of said reference clock signal counted during said successive cycles of said N-divided output signal;
establishing a setting cycle;
comparing a latched value of the cycles counted and said setting cycle;
adding or subtracting a first constant to or from said setting cycle in response to a difference between said latched value of the cycles counted and said setting cycle;
adjusting said setting cycle in accordance with said adding or subtracting when the difference between said latched value and said setting cycle exceeds a second constant during a predetermined number of said successive cycles of said N-divided output signal, thereby determining an approximate value of $T_H$; and
determining the approximate frequency $f_H$ on the basis of $T_H$.

7. A method according to claim 6 comprising, when said difference between said latched value of the cycles counted and said setting cycle fails to exceed said second constant during said predetermined number of successive cycles of said N-divided output signal, the step of employing a previous value of $f_H$.

* * * * *